United States Patent
Lewis

(10) Patent No.: US 8,218,326 B2
(45) Date of Patent: Jul. 10, 2012

(54) RIVET STANDOFF FOR PANEL CONNECTION

(75) Inventor: Donald C Lewis, Richmond, CA (US)

(73) Assignee: Force10 Networks, Inc., San Jose, CA (US)

( * ) Notice: Subject to any disclaimer, the term of this patent is extended or adjusted under 35 U.S.C. 154(b) by 358 days.

(21) Appl. No.: 12/566,075

(22) Filed: Sep. 24, 2009

(65) Prior Publication Data

US 2011/0069462 A1    Mar. 24, 2011

(51) Int. Cl.
H05K 7/00 (2006.01)
F16B 13/04 (2006.01)
B21J 15/02 (2006.01)

(52) U.S. Cl. ............... 361/759; 411/34; 29/524.1

(58) Field of Classification Search ........... 361/759; 411/34

See application file for complete search history.

(56) References Cited

U.S. PATENT DOCUMENTS

2004/0218371 A1* 11/2004 Ireland ............... 361/759

* cited by examiner

*Primary Examiner* — Tuan T Dinh
*Assistant Examiner* — Mukund G Patel
(74) *Attorney, Agent, or Firm* — Haynes and Boone, LLP

(57) ABSTRACT

A standoff joins a circuit board to a chassis member using a rivet. The standoff has a cap surface with a hole that allows the body of an unexpanded blind rivet to pass into an inner cavity of the standoff. The rivet is then expanded against the underside of the cap. In use, the standoff rests against the underside of a circuit board, and the rivet passes through a hole in the circuit board and into the standoff. The rivet head engages the circuit board to hold the circuit board against the standoff.

4 Claims, 5 Drawing Sheets

RIVET STANDOFF FOR PANEL CONNECTION

BACKGROUND

1. Field of the Invention

The present disclosure relates generally to methods and apparatus for mounting an electrical circuit board to another structure, and more particularly to a standoff adapted for such purposes.

2. Description of Related Art

In the electronics industry, fasteners are used to mount electrical circuit boards to other structures such as a chassis, a support member, or another circuit board. Among such fasteners are a class of fasteners typically referred to as a "standoff," which secures a circuit board to a chassis member with an intervening gap to prevent shorting of the circuit components to the chassis, allow for the backside mounting of components, provide space for cooling airflow, etc.

A typical standoff 10 is illustrated in FIGS. 1A and 1B. Standoff 10 comprises a spacer post 13 having a tapped hole 11 passing longitudinally through the post. At one end of post 13, a compression section 12, of smaller diameter than post 13, extends from post 13. During assembly, compression section 12 is compression-fit into a hole 14 in a chassis member 16. The opposite end of standoff 10 is secured to a circuit board 18 by a screw 17, inserted through a hole in circuit board 18 and threaded into the tapped hole 11 inside spacer post 13.

BRIEF DESCRIPTION OF THE DRAWINGS

The present invention can be best understood by reading the specification with reference to the following Figures, in which.

DETAILED DESCRIPTION

The present disclosure presents an attractive alternative to screw-mounted standoffs. Screw-mounted standoffs have several disadvantages, among these: a possibility of stripping the standoff threads when tightening; a possibility of over-compressing and/or overtwisting the circuit board material, resulting in damage to the circuit board; a possibility of damaging the circuit board should a driver slip during assembly; and a possibility of the screw working loose.

Figure 1A:
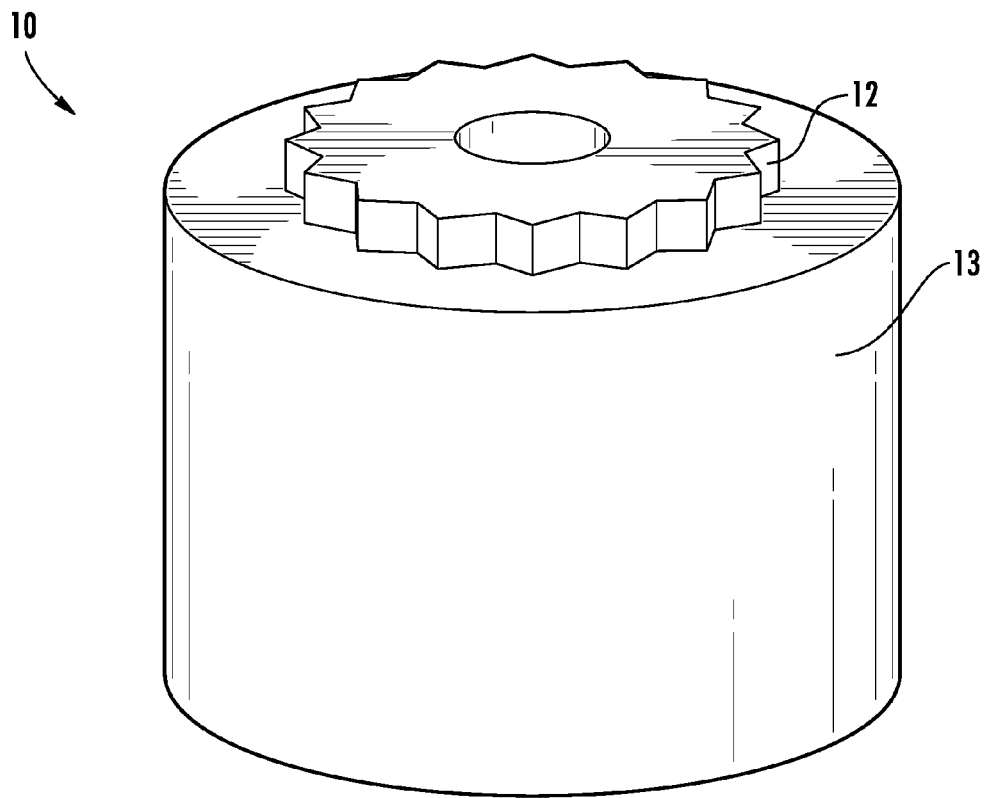
FIG. 1A shows, in perspective, a standoff having a compression section at one end and a post.
Figure 1B:
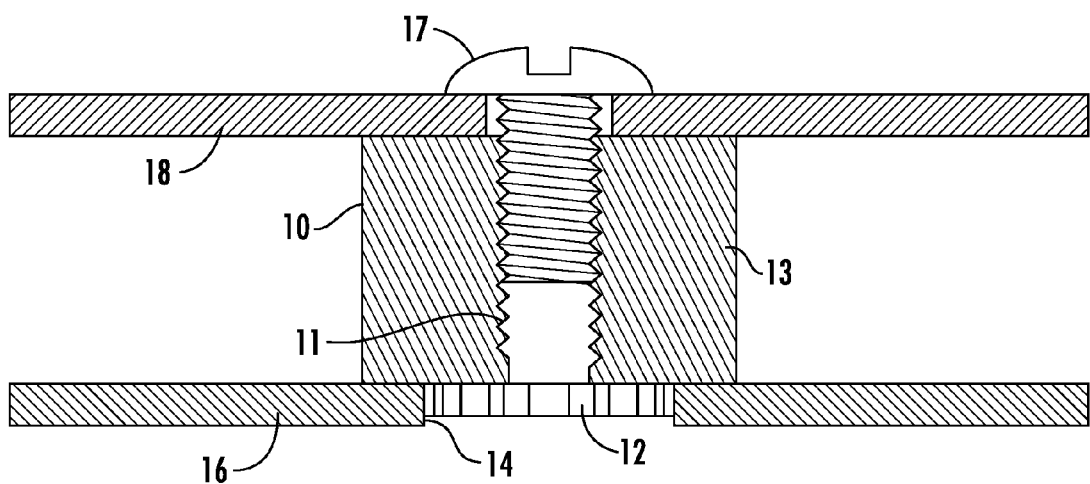
FIG. 1B shows the standoff of FIG. 1A in cross-section, connecting a circuit board to a chassis.
Figure 2A:
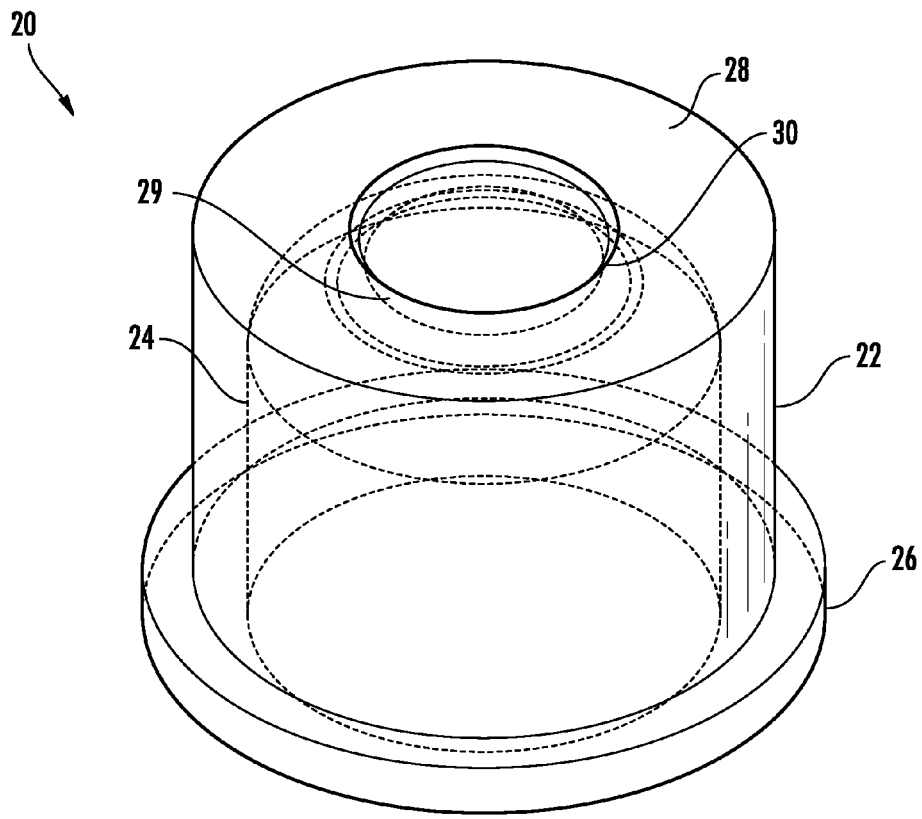
FIG. 2A illustrates, in perspective, a standoff according to an embodiment.

The standoffs disclosed herein allow, instead of screw connection, rivet connection of a circuit board or other member to a standoff. The FIG. 2A perspective view shows one embodiment 20 of a rivet standoff, with a FIG. 2B cross-section showing rivet standoff 20 securing a chassis member 50 to a circuit board 60 in a spaced configuration. Rivet standoff 20 has a spacer post 22 with a longitudinal hollow 24. A clinch surface 26 is formed on the bottom end of spacer post 22. A cap 28 is formed on the top end of spacer post 22. A hole 29 passes through cap 28 to longitudinal hollow 24. The hole 29 is of smaller diameter than the longitudinal hollow 24, such that an inner surface of cap 28 forms a compression ledge against which a rivet can be expanded and held. An optional raised lip 30 around the periphery of hole 29 forms an alignment feature as an aid for centering a hole in a circuit board on cap 28.

Figure 2B:
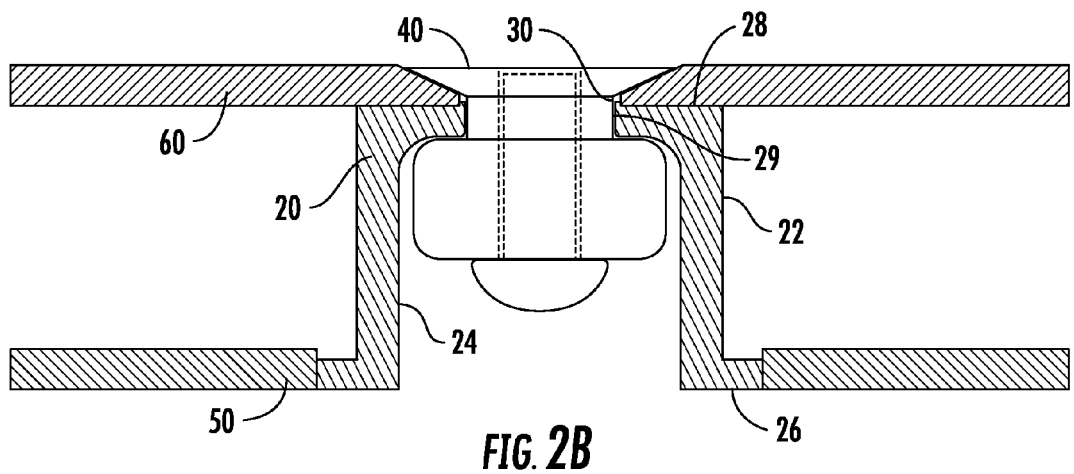
FIG. 2B depicts the standoff of FIG. 2A in cross-section, connecting a circuit board to a chassis.

The FIG. 2B cross-section shows a completed standoff assembly. The clinch surface 26 of rivet standoff 20 is secured to chassis member 50. An expanded blind rivet 40 secures the cap end 28 of rivet standoff 20 to the underside of circuit board 60. The body of the rivet passes through a hole in the circuit board and spacer cap hole 29, with the blind rivet head contacting the circuit board and the expanded portion of the blind rivet body contacting the underside of the standoff cap 28, trapping the circuit board and the rivet standoff between the rivet head and body.

Figure 3A:
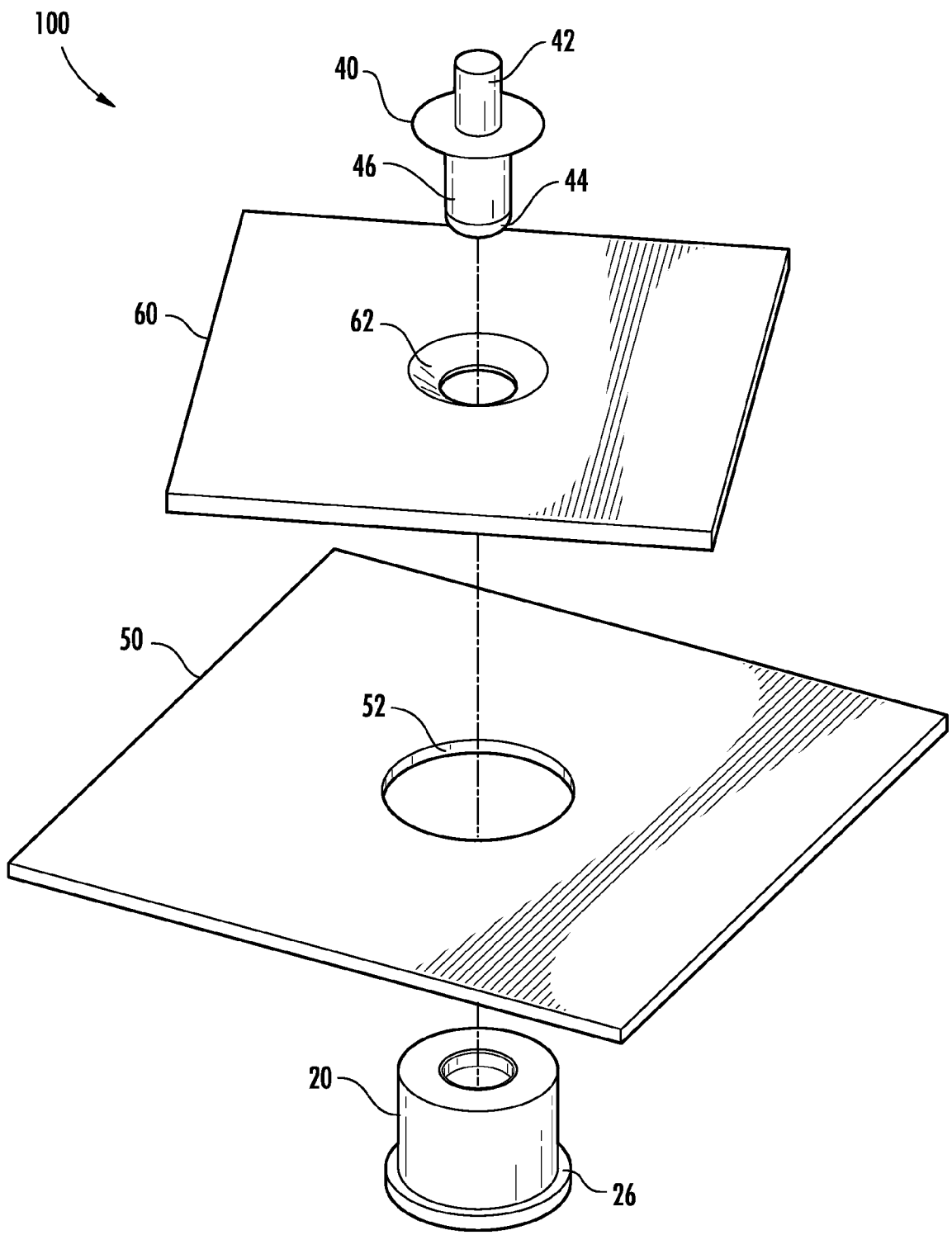
FIGS. 3A-3C illustrate steps in the process of joining a chassis to a circuit board using a standoff embodiment.
Figure 3B:
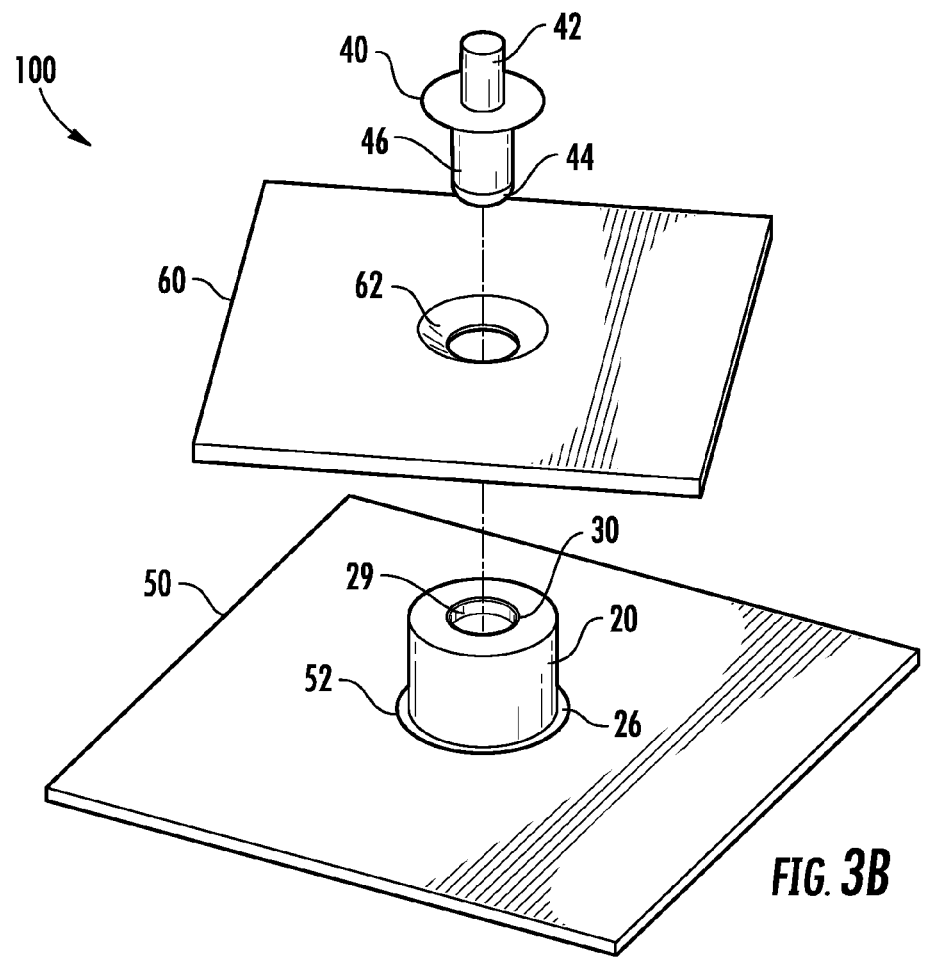
Figure 3C:
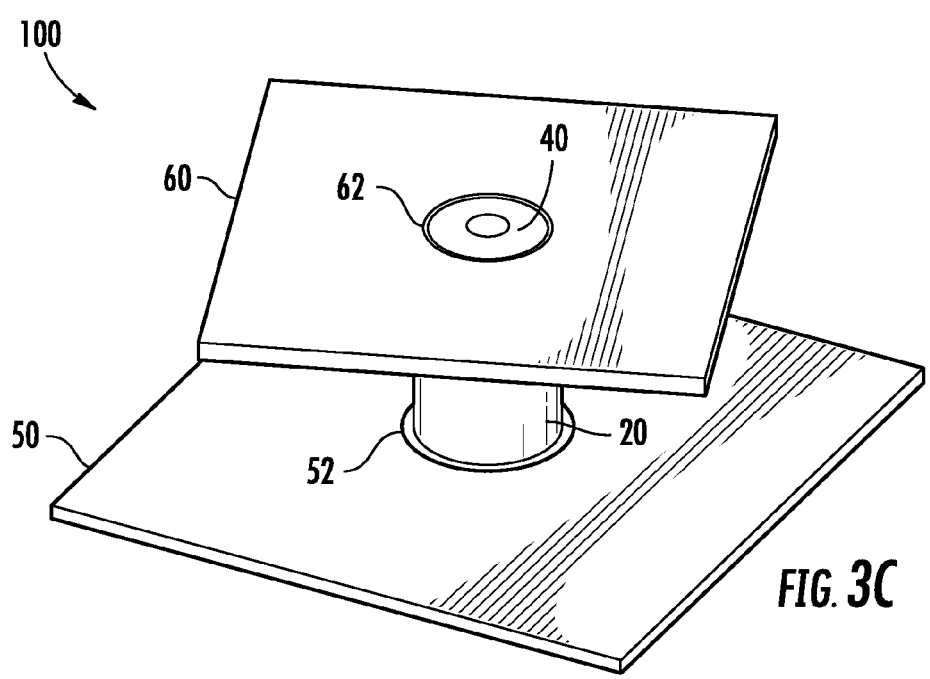

FIGS. 3A to 3C show, in perspective view, an assembly process for an electronic assembly 100, according to an embodiment. Prior to assembly (FIG. 3A), electronic assembly 100 comprises four separate pieces—rivet standoff 20, a rivet 40, a chassis member 50, and a circuit board 60. Rivet 40 is a conventional blind rivet, with a mandrel 42 passing through the head and rivet body 46, mandrel 42 terminating in a mandrel head 44. Chassis member 50 contains an appropriately sized hole 52 for a clinch surface 26 on rivet standoff 20. Circuit board 60 contains a beveled hole 62, preferably sized to engage but not pass the beveled head of rivet 40, while passing the mandrel head 44 and unexpanded body 46 of rivet 40.

In FIG. 3B, the clinch surface 26 of rivet standoff 20 has been press-fit into hole 52 in chassis member 50. Circuit board hole 62 is vertically aligned over a hole 29 in the cap of standoff 20. The hole 29 is preferably sized to pass the mandrel head 44 and unexpanded body 46 of rivet 40. A lip 30 surrounding hole 29 is sized to fit within the minimum diameter of beveled hole 62, allowing positive alignment of the circuit board 60 to the rivet standoff 20 during assembly.

In FIG. 3C, circuit board 60 has been brought down on top of standoff 20, and rivet 40 has been inserted through hole 62 and hole 29 (not visible in FIG. 3C). The rivet is expanded by pulling the mandrel 42 up with respect to the head of rivet 40, thereby causing mandrel head 44 to deform rivet body 46 and form a bulb. At a predetermined force, mandrel 42 breaks to form a finished rivet. The rivet head is preferably flush or sunk below the top surface of circuit board 60. In a given embodiment, the mandrel breaking force can be set such that the circuit board will not be deformed. In an alternate embodiment, the depth of beveled hole 62 can be set such that after a desirable and/or allowable amount of circuit board deformation, the head of rivet 40 will contact lip 30 on standoff 20, preventing further circuit board deformation should the mandrel breaking force exceed a desired limit.

Figure 4:
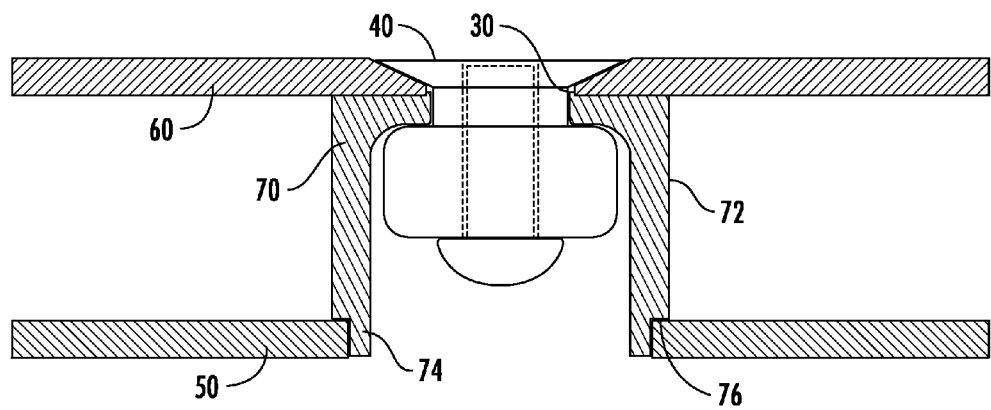
FIGS. 4 and 5 illustrate, in cross-section, alternate standoff embodiments.
Figure 5:
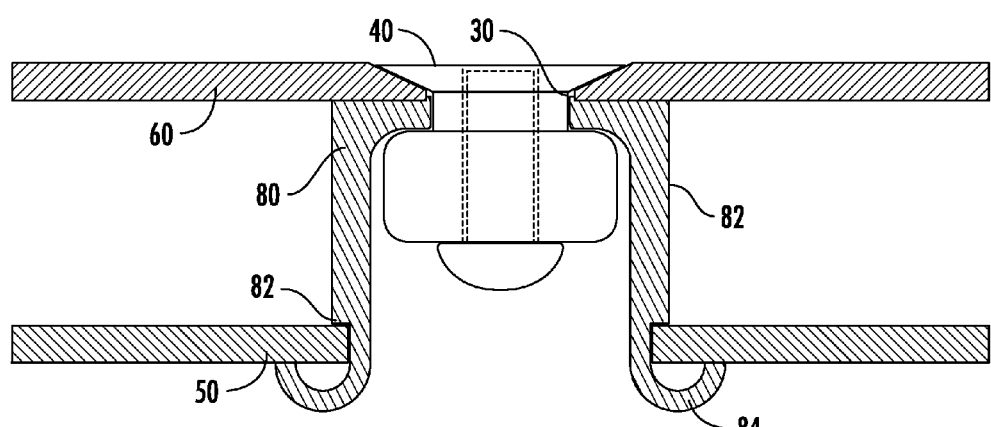

FIGS. 4 and 5 contain assembly cross-sections for two different rivet standoff embodiments 70 and 80, respectively. Rivet standoff 70 has a post 72 with a lower end section 74 having a smaller outer diameter than that of the main body of post 72. The transition to end section 74 thus forms a ledge surface 76. During assembly, end section 74 is inserted in a hole in chassis member 50 such that ledge surface 76 rests against the upper surface of chassis member 50. Rivet standoff 70 is fixed to chassis member 50, e.g., by welding. Exemplary welding methods include spin-welding and electronic welding.

Rivet standoff 80, like rivet standoff 70, has a post 82 with a lower end section 84 having a smaller outer diameter than that of the main body of post 82. Lower end section 84 is long enough to pass completely through a hole in chassis member 50 prior to a ledge surface 82 making contact with the upper surface of chassis member 50. Rivet standoff 80 is fixed to chassis member 50 using, e.g., a flaring tool, to deform lower end section 84 such that is cannot pass back through the hole in chassis member 50, thereby holding rivet standoff 80 in place.

Those skilled in the art will appreciate that the embodiments and/or various features of the embodiments can be combined in ways other than those described. The hole in the circuit board need not be beveled—in an alternate embodiment, the rivet has a pan head with a lower surface that engages the upper surface of the circuit board. Washers, spacers, etc., may also be included in the assembly. Several representative methods of attaching the rivet standoff to a chassis member have been shown, but these are meant to be exemplary. The expansion zone of the rivet standoff may have one or more inner sidewalls that engage a rivet bulb during expansion of the rivet, instead of or in conjunction with the rivet bulb engaging the underside of the rivet standoff cap.

Although the specification may refer to "an", "one", "another", or "some" embodiment(s) in several locations, this does not necessarily mean that each such reference is to the same embodiment(s), or that the feature only applies to a single embodiment.

What is claimed is:

1. An electronic assembly comprising:
    a first member defining a first member hole;
    a circuit board defining a circuit board hole and in a spaced configuration from the first member;
    a standoff coupling the first member and the circuit board in the spaced configuration, the standoff including:
    a lip extending from a first end of the standoff, the lip engaging the circuit board to align the circuit board hole with a standoff hole defined by the standoff; and
    a securing feature extending from a second end of the standoff opposite the first end, the securing feature located in the first member hole to secure the standoff to the first member;
    a rivet including a body section extending through the circuit board hole and the rivet hole to the circuit board to the standoff, the rivet including a rivet head to engage the lip when the rivet is coupling the circuit board to the standoff but prior to a mandrel breaking force of a mandrel on the rivet exceeding a predetermined limit; and
    the rivet head is located in the circuit board hole when the rivet has coupled the circuit board to the standoff such that the rivet head is flush with a board surface of the circuit board.

2. The electronic assembly of claim 1, wherein the securing feature includes a ledge surface that is operable to engage the first member adjacent the first member hole, and an end section that is operable to enter the first member hole.

3. The electronic assembly of claim 2, wherein the securing feature includes a deformable portion extending from the end section that is operable to be deformed to engage the first member adjacent the first member hole and opposite the first member from the ledge surface.

4. The electronic assembly of claim 1, wherein the mandrel is operable to break from the rivet head and the body section when the rivet is coupling the circuit board to the standoff but prior to deformation of the circuit board.

* * * * *